(12) United States Patent
Tsai

(10) Patent No.: US 6,175,125 B1
(45) Date of Patent: Jan. 16, 2001

(54) SEMICONDUCTOR STRUCTURE FOR TESTING VIAS INTERCONNECTING LAYERS OF THE STRUCTURE

(75) Inventor: Chaochieh Tsai, Taichung (TW)

(73) Assignee: Taiwan Semiconductor Manufacturing Company, Hsin-Chu (TW)

( * ) Notice: Under 35 U.S.C. 154(b), the term of this patent shall be extended for 0 days.

(21) Appl. No.: 09/307,839

(22) Filed: May 10, 1999

(51) Int. Cl.[7] .................. H01L 23/58; H01L 23/48; H01L 23/52; H01L 29/40
(52) U.S. Cl. ............... 257/48; 257/773; 257/774
(58) Field of Search ............... 257/48, 773, 774

(56) References Cited

U.S. PATENT DOCUMENTS

| | | | |
|---|---|---|---|
| 4,956,611 | 9/1990 | Maltiel | 324/699 |
| 5,514,974 | 5/1996 | Bouldin | 324/763 |
| 5,699,282 | 12/1997 | Allen et al. | 364/571.01 |
| 5,736,863 | 4/1998 | Liu | 324/765 |
| 5,900,645 | * 5/1999 | Yamada | 257/48 |
| 5,982,042 | * 11/1999 | Nakamura | 257/786 |

* cited by examiner

Primary Examiner—Ngân V. Ngô
(74) Attorney, Agent, or Firm—George O. Saile; Stephen B. Ackerman; William S. Robertson

(57) ABSTRACT

A wafer for testing a manufacturing process for vias has a large number of vias (millions) formed into strings that have an open circuit resistance if the string contains a defective via and have a resistance of a few thousand ohms if the string is good. A multiplexor circuit is formed on the test wafer and scans the via strings and produces a binary output denoting that the addressed string is good or defective. The addresses are generated off the wafer by a compute and a defective string is readily identified.

12 Claims, 3 Drawing Sheets

SEMICONDUCTOR STRUCTURE FOR TESTING VIAS INTERCONNECTING LAYERS OF THE STRUCTURE

FIELD OF THE INVENTION

This invention relates generally to the manufacture of semiconductor devices, and more specifically it relates to a chip in which a large number of vias can be formed and then tested accurately.

BACKGROUND

A semiconductor chip is commonly formed as a multi-level structure that includes a layer of a vias, conductors that interconnect circuit nodes in the layers above and below the via layer. The layer above a via layer is a conductive film that is shaped to interconnect vias or to connect vias to other circuit nodes. The structure below the via layer may be a similar conductive film or it can be a surface of the substrate that has for example transistor terminals. A dielectric supports the vias and insulates the circuit nodes.

THE PRIOR ART

It is a general object in this art to test and improve the manufacturing steps that form these vias. In one technique of the prior art, a wafer or a chip or a few chips on a wafer are formed with a layer having a large number of vias. The conductive layers above and below the via layer are shaped to interconnect the vias into a series string that can be tested by testing the continuity of the string.

A string of vias will produce a resistance that is the sum of the individual resistances. A defective via has an open circuit resistance, and a string with one defective via has an open circuit resistance. A string of good vias has a resistance equal to the product of the number of vias in the string and the resistance of one via—a few ohms.

In a test using this prior art method, a chip is manufactured with a string of vias that have been formed by a process that is being tested. Probes are connected to the ends of the via string and the resistance is measured. The test gives an improved understanding of the associated manufacturing process that may lead to improvements in the process.

It would be advantageous to test a very large number of vias in a test wafer. In the specific example that will be described later, the test structure has 58,982,400 vias. Such a string has a resistance of about 590 megohms. (A good via has a resistance of a few ohms, about 9 or 10 ohms in the technology used for the preferred embodiment.) It is not feasible to measure a resistance this high in a semiconductor device, and the string has an effectively open circuit resistance, and it is not possible to distinguish such a string of good vias from a similar string with a defective via.

SUMMARY OF THE INVENTION

I form a large number of vias into separate strings that each have a resistance that is easily measured. The specific embodiment that will be described later has a total of 58,982,400 vias (as in the example of the prior art) and these vias are organized in an array of 900 rows and 36,536 columns. (The row and column terminology is of course arbitrary.) The 900 vias in each column are interconnected into series strings. Thus a string of good vias has a resistance of about 8100 ohms (9 ohms/via×900 vias). This resistance value is easily measured and readily distinguished from the open circuit resistance of an otherwise similar string with a defective via.

I provide a multiplexor circuit on the test structure to connect the strings one at a time in to a circuit that tests for continuity. The multiplexor addresses the via strings one at a time in response to a sequence of address signals that are supplied to the test structure from a computer. Thus the test is easily controlled and the identification of a defective via string is available at the computer.

Other features of the invention will appear in the description of a preferred embodiment.

THE DRAWING

THE PREFERRED EMBODIMENT

Figure 1:
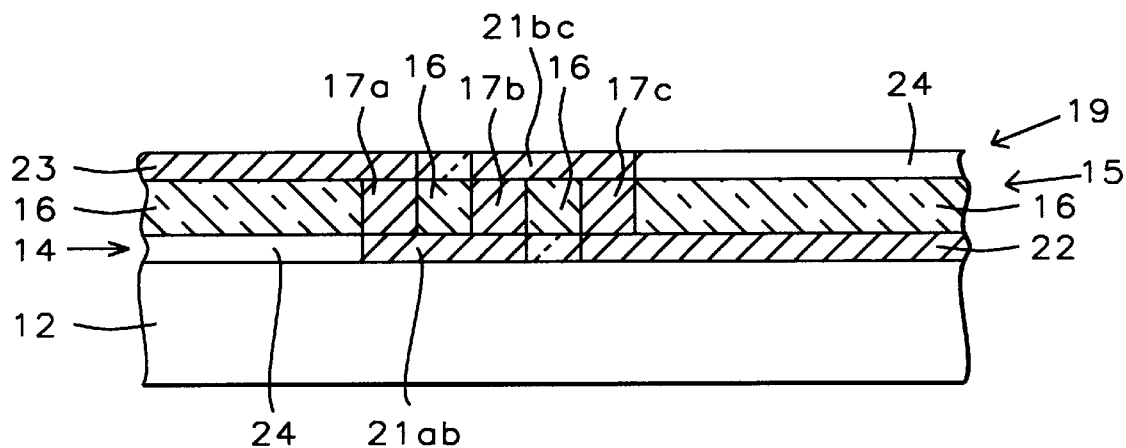
FIG. 1 is an edge view of a wafer in the region of a few vias that illustrate the test wafer of this invention.

Introduction—FIG. 1

FIG. 1 shows a semiconductor test structure that comprises a wafer substrate 12, a conductor layer 14 formed on the substrate, a via layer 15 having a dielectric layer 16 formed above conductor layer 14 and representative vias 17a, 17b, 17c in the dielectric, and a conductor layer 19 formed above the via layer.

FIG. 1 represents the vias that are formed in one chip. Ordinarily this chip is manufactured as part of a wafer that has several chips. Some or all or none of the other chips on the wafer can be formed as via test structures and these vias can be formed by the same manufacturing process or by different processes that are to be compared.

The two conductor layers 14, 19 will be called the lower conductor layer and the upper conductor layer respectively, corresponding to the orientation of the drawing. Various materials are well known for layers of this type. The conductor layers are ordinarily metal films but from a more general standpoint the vias and the conductor layers are formed of one or more materials that are to be tested.

The two conductor layers are formed into individual conductors that interconnect the vias. A conductor 21ab in the lower conductor 14 interconnects vias 17a and 17b, and a similar conductor 21bc in the upper conductor layer 19 interconnects vias 17b and 17c. Conductor 22 in the lower layer and conductor 23 in the upper layer continue this pattern for all of the vias that are connected into the same string. Conductor 22 and conductor 23 also illustrate conductors in either layer that connect the two end vias in the string, as will be explained later. Reference character 24 identifies other regions in layers 14, 19. These regions correspond to the edges of other conductors that are not part of this description or a dielectric the fills the spaces between conductors in these layers.

FIG. 1 is simplified and is representative of semiconductor structures having other layers between substrate 12 and the lower conductor layer 14 or above the upper conductor layer 19.

Figure 2:
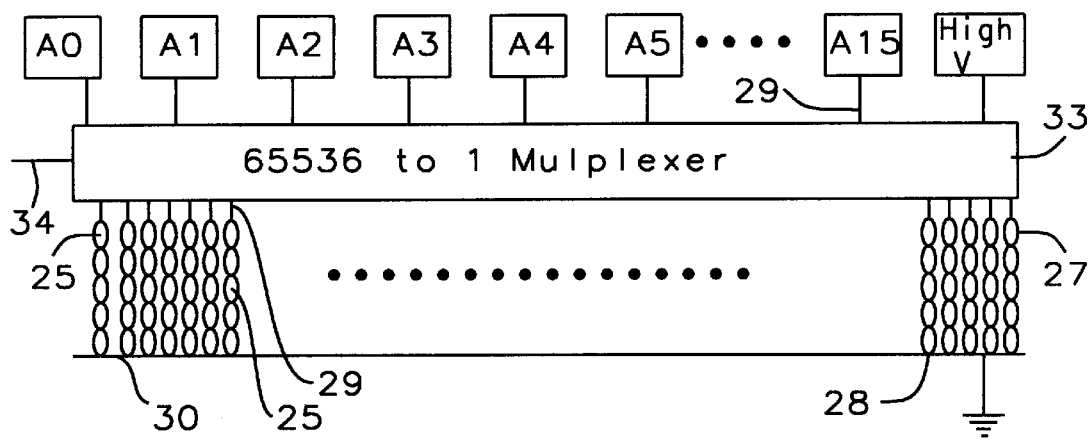
FIG. 2 is a diagram of the via strings and the multiplexor circuit in a top view of the wafer of FIG. 1.

The Via Strings—FIG. 2

In FIG. 2, the vias 17a, 17b, 17c are shown from the top and are represented schematically by abutting ovals 26 that schematically represent both the via and the interconnections in the two conductor layers 14 and 19. The vias are arranged in a suitable way for the interconnections 21ab and 21bc between adjacent vias and the conductors 22, 23 that connect a string to other components. Preferably, as FIG. 2 shows, the vias are arranged in a simple array of rows 27 and columns 28.

The vias are interconnected along the columns to form strings. FIG. 2 shows each column with a few vias that are representative of a large number of vias, preferably 900 vias in each string.

FIG. 2 shows representative columns 28 with a horizontal ellipsis to indicate a large number of strings, 65,536 in the preferred embodiment.

One end of each string in FIG. 2 is connected to a common connection node 30 which is preferably the common or ground node of the chip. Node 30 is formed in the lower layer 14 or the upper layer 19 as represented by conductors 22 and 23 in FIG. 1. The other end of each string is given a connection 29 to a multiplexor circuit 33 that will be described next. Connections 29 are preferably formed in the lower conductor layer 14 (because the multiplexor is implemented in logic gates formed in substrate 12, as will be described).

The Multiplexor Circuit—FIG. 2

Multiplexor circuit 33 receives the inputs on connections 29 from the via strings and produces a corresponding signal on an output line 34 in a scanning sequence.

Figure 3:
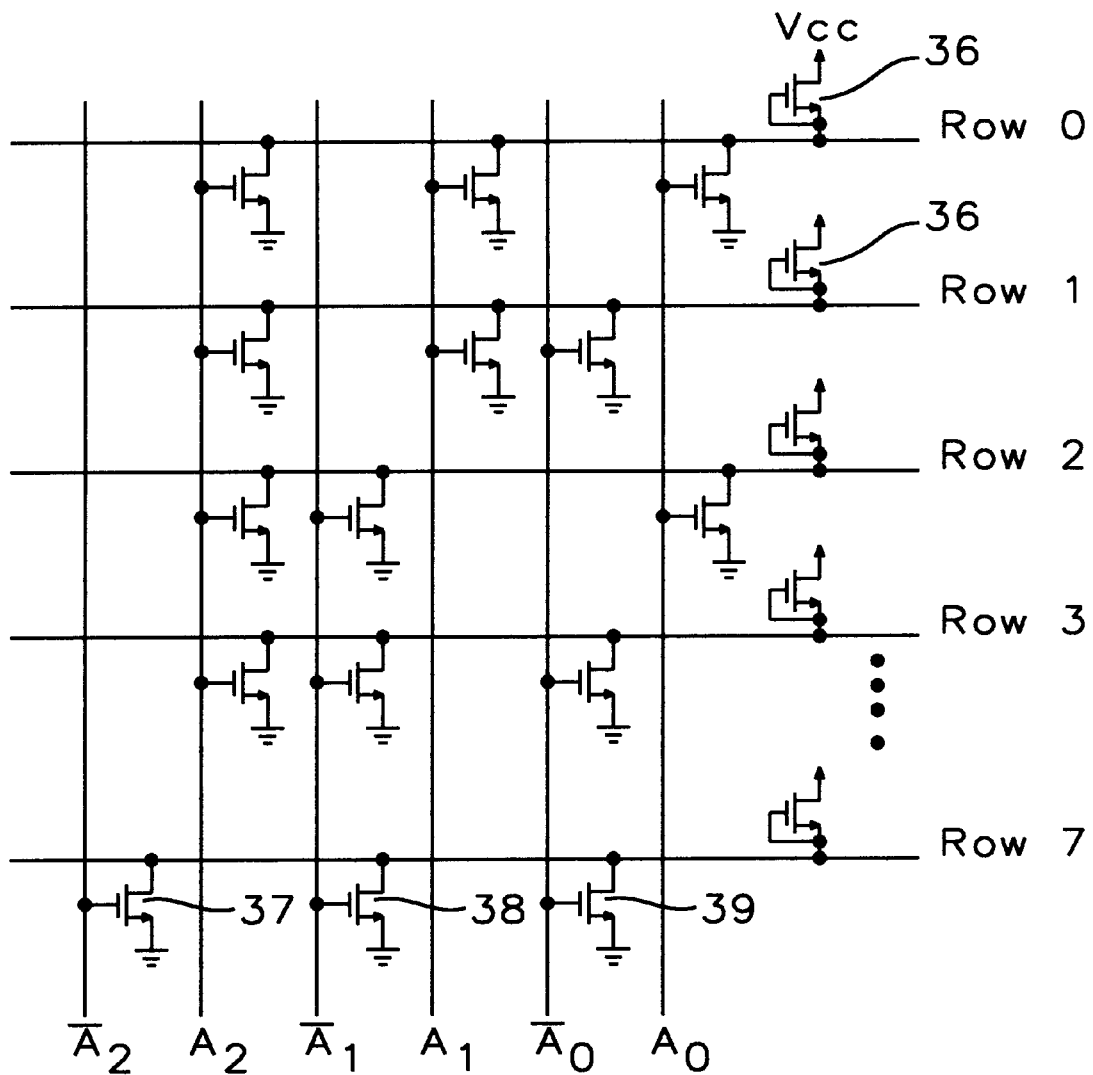
FIG. 3 is a circuit schematic diagram of an address circuit in the multiplexor of FIG. 2.
Figure 4:
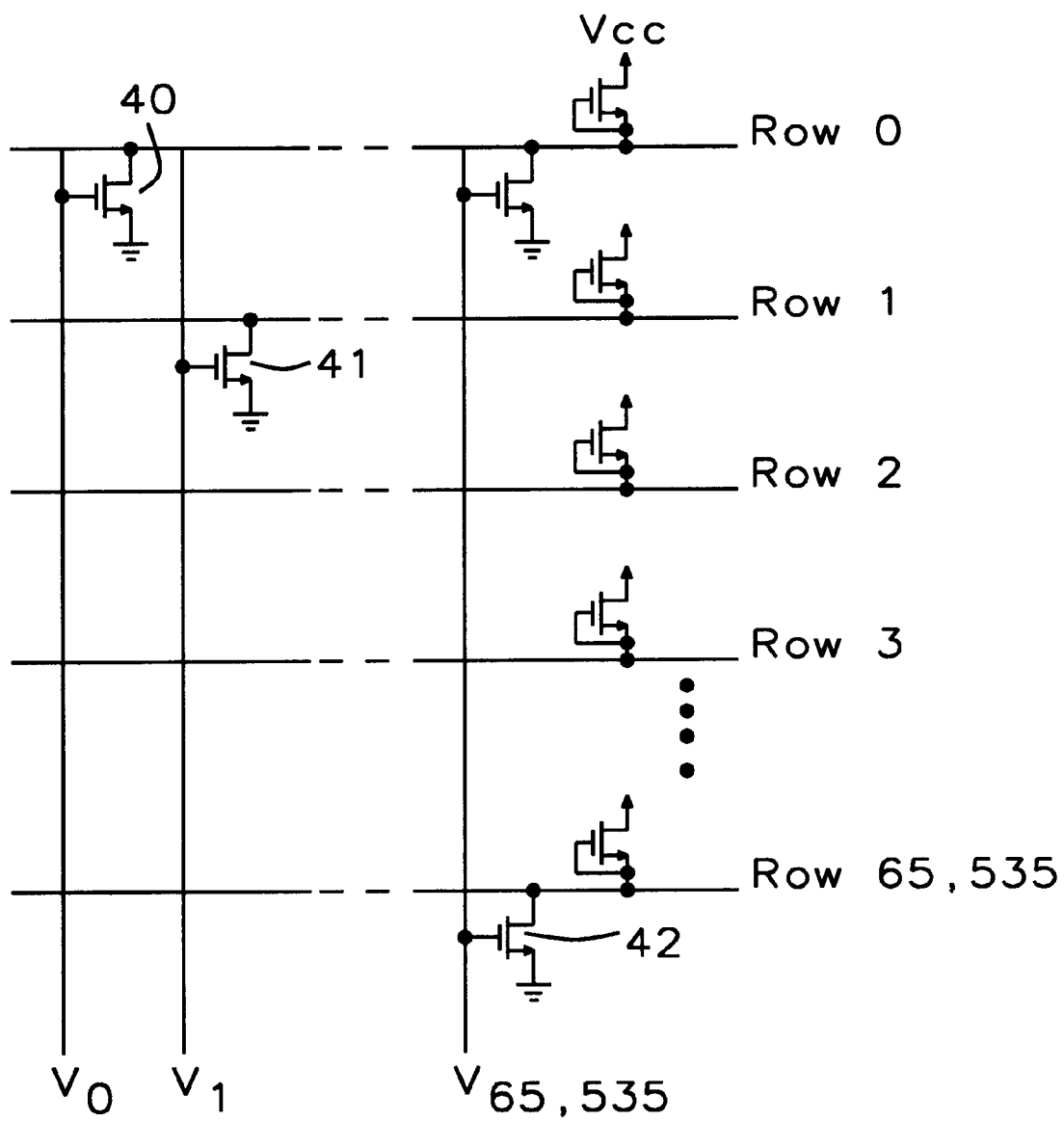
FIG. 4 is a circuit schematic similar to FIG. 3 showing a a scanning circuit in the multiplexor of FIG. 2.

Multiplexor circuits are well known and any suitable multiplexor but a review of the general features of a multiplexor circuit will help to introduce the relation of the multiplexor to other components of my test structure. Any suitable multiplexor can be used as part of my test structure. The logic gates of the preferred circuit of FIGS. 2, 3, and 4 are implemented in the wafer substrate 12, as will be understood from the description of these components.

A multiplexor has several signal carrying input lines (29 in FIG. 2) and one signal output line (34 in FIG. 2). It includes a combinatorial logic circuit that in concept has an AND gate for each of its input lines and an OR gate that combines the output lines of the AND gates and thereby forms the single output. When the AND gates are opened (enabled) one at a time, the signals on the multiplexed input lines appear in time succession at the output of the OR gate.

These AND gates have additional input lines that enable a single AND gate and inhibit the others. These inputs to the AND gates are produced by a sequential logic circuit.

In my preferred embodiment, the sequential logic for multiplexor 33 is located off the test structure, and the scanning signal is supplied to the test structure in an encoded form which will be called an address because it is convenient to think of each of the string lines 29 as having a unique address in the range 0 to 65,535.

The 65,536 inputs to the multiplexor circuit can be encoded in 16 bits (because $\log_2 65{,}536 = 16$.) The test unit has sixteen input pads, A0–A15 and the multiplexor circuit 33 has a decoder (FIG. 3) that responds to these sixteen bits to product the scanning signal for the associated via string.

The address signals are applied to a bus that is 16 bits wide and is connected to pads A0 through A15 in FIG. 2. (Pads A6 through A14 are indicated by ellipsis.) A computer having an output for such a bus can be programmed to provide the address sequence. The program can be formed by a simple for loop in any convenient programming language. Connections between the bus and the address pads A0 through A15 can be formed in any suitable way, as is customary for making other connections to a test wafer.

The Address Circuit—FIG. 3

Although the circuit of FIG. 3 by itself is conventional, a summary description will help to explain the relation of the multiplexor to the other components. The circuit of FIG. 3 has an array of eight row lines and six column lines.

The column lines are identified by the logic symbols that these lines carry, A0, A1 and A2 and their compliments, which are indicated by the bar over the symbol.

The input signals A0, A1, and A2 appear at the corresponding input pads A0, A1 and A2 in FIG. 2. The complements are formed from the address signals by any suitable circuit as is well known for these array circuits. Commonly the complement is formed by an FET connected as an inverter.

The row lines are identified by the legends Row 0 . . . Row 7. The lines for Row 0 to Row 3 and Row 7 are shown in the drawing and the other row lines are represented by a vertical ellipsis.

Each row line has an FET 36 connected as a resistor to pull the line up to a potential point Vcc. (It is convenient but arbitrary to associate an up voltage with a binary 1 and a down level with a binary 0.) Thus, in the absence of other effects which will be described, each row line has a high logic value.

FETs 37, 38, 39 along the line for Row 7 are representative of FETs that are located at selected cross over points of the row lines and column lines. For example, FET 37 has its drain terminal connected to the line for Row 7 and its gate terminal connected to column line NOT A3. When address signal A3 is low and signal NOT A3 is high, FET 37 is turned on and conducts in its drain to source circuit and pulls down line Row 7. Thus, the line for Row 7 is pulled down whenever any address NOT A0, NOT A1 or NOT A2 is high. The line for Row 7 remains high only when all three of these signals are low: when A0, A1 and A2 are all high. Each other row line remains high on the coincidence of a unique combination of the address signals and when the address signals are given a counting sequence each row line goes high at one point in the sequence.

To look at the circuit of FIG. 3 from a different viewpoint, the three FETs along the line for Row 7 form the logic function A0 AND A1 AND A2 on line Row 7. Each row of the array is similarly arranged to produce one of the eight possible logic products that can be formed with three inputs.

From a more general standpoint, the array of FIG. 3 has a number of inputs equal to the number of address bits (A0, A1 and A2) and their complements. The number of row lines is the number of address bits (without their complements) as an exponent of 2. The array of FIG. 3 has 3 address bits and $2^3 = 8$ row lines. Stated differently, there is a row line for each unique combination of the address bits (without their complements).

The simplified circuit of FIG. 3 is readily expanded to have 65,536 row lines, one for each via string, and 32 column lines for the sixteen address bits A0 to A15 and their complements.

The AND logic gates along the row lines in FIG. 3 correspond to the selection AND gates that were introduced in the conceptual description of a multiplexor circuit.

The Scanning Circuit—FIG. 4

The selection circuit can be formed as the modification of the address array which is shown in FIG. 4. This array has a row line for each row of the address array and a column line for each via string. The row lines are in fact extensions of the address array and have the same legends. The column lines are formed by the via string connections 29 and have the legends V0, V1 . . . V65,535. (The address array and the selection array can of course be formed as a single structure but from the standpoint for this explanation they are separate in concept.)

Each column line and each row line has one FET located at a crossover of the row and column lines, as FETs 40, 41, and 42 illustrate. The drawing shows the simplest example in which the FETs are located along a diagonal of the array.

Suppose that address bit A0 is high and the other address bits are low. In response to this address, signal Row 0 is high and all of the other row lines are low, as already explained.

If the via string for input V0 is good, it pulls down the gate of the associated transistor 40 and signal Row 0 falls to indicate a good via string. If via string for input V0 is bad, this signal remains high and the signal Row 0 remains high and thereby denotes the bad string.

If the signal V1 is high at this time, it turns on FET 41 but this has no effect because signal Row 1 is already low from the operation of the address circuit. If signal V1 is low, FET 41 is not turned on and thereby has no effect on the low state of signal Row 1.

The address signal on the row lines in FIG. 3 can be used in various other ways to scan the via strings.

The OR Logic Function

The 65,536 row outputs of the scanning array are combined in an OR function. Circuits for this function are well known. Commonly, AND Invert circuits are arranged in a tree configuration to handle the 65,536 signals in small groups.

Other Embodiments

From the description of a preferred embodiment of the invention and the suggestions for a more general understanding of the invention, those skilled in the art will find modifications within the skill of the art and the spirit of the claims.

I claim:

1. A multi-layer semiconductor test structure for use in testing a manufacturing method for producing vias in a related semiconductor device, a good via having a resistance of a few ohms and a defective via having the resistance of an open circuit, the test structure comprising, a substrate and a via layer formed above the substrate having a plurality of vias and a dielectric supporting the vias, upper and lower conductor layers located immediately above the via layer immediately below the via layer respectively, each conductor layer having a plurality of coplanar conductors each arranged to interconnect two adjacent vias in a pattern alternating between the first and second conductor layers to form a plurality of series strings of interconnected vias, the resistance of a string being distinguishable from the resistance of an open circuit formed by a defective via, conductor means in a selected conductor layer connecting one end of each string to a common connection point, a multiplexor circuit formed on the wafer and having a plurality of input conductors each connected to an associated via string and having an output conductor representing one of the input conductors in a selected multiplexing sequence, and a logic circuit in the multiplexor differently responsive to the resistance of a good via string and a defective via string for signaling whether the via string being scanned is good or defective.

2. The semiconductor test structure of claim 1 wherein the logic circuit includes gates differently responsive to the resistance of a good via string and a defective string, whereby the output of the multiplexor is a binary signal denoting a good string or a defective string.

3. The semiconductor test structure of claim 2 including connection points for receiving an address and wherein the logic means includes means responsive to the address for selecting one via string for test.

4. The semiconductor test structure of claim 3 wherein the logic means comprises an array of row wires and first and second sets of column wires, the column wires of the first set being connected to the address points, transistors located at cross over points of the row wires and the column wires of the first set in a pattern to select one of the row wires for an address, the column wires of the second set being connected to the via strings, and transistors located at cross over points of the row wires and the column wires of the second set in a pattern to produce a binary signal on the addressed row line indicating the status of the selected via string.

5. The semiconductor test structure of claim 3 wherein the vias are arranged in a matrix of rows and columns in the via layer and the vias are interconnected to form each row of vias into a via string.

6. The semiconductor test structure of claim 5 wherein the resistance of one via is on the order of a few ohms.

7. The semiconductor test structure of claim 6 wherein the resistance of one via is about 9 ohms.

8. The semiconductor test structure of claim 7 wherein the number of vias is on the order of 50 million.

9. The semiconductor test structure of claim 8 wherein the number of vias in a row and the number of columns of vias is selected to make the conductivity of a string of good vias easy to distinguish in said logic means from a string with at least one defective via.

10. The semiconductor test structure of claim 9 wherein the number of rows and columns is selected to give a resistance of a few thousand ohms in a string of good vias.

11. The semiconductor test structure of claim 10 wherein the number of vias in a string is on the order of a thousand.

12. The semiconductor test structure of claim 11 wherein the wafer has about 58,982,400 vias divided into 65,536 strings with 900 vias in each string.

* * * * *